United States Patent
Choi

(10) Patent No.: US 10,541,296 B2
(45) Date of Patent: Jan. 21, 2020

(54) DISPLAY DEVICE

(71) Applicant: LG Display Co., Ltd., Seoul (KR)

(72) Inventor: Heedong Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/138,711

(22) Filed: Sep. 21, 2018

(65) Prior Publication Data

US 2019/0103456 A1 Apr. 4, 2019

(30) Foreign Application Priority Data

Sep. 29, 2017 (KR) .......................... 10-2017-0128228

(51) Int. Cl.
*H01L 27/32* (2006.01)
*G09G 3/3225* (2016.01)

(52) U.S. Cl.
CPC ....... *H01L 27/3276* (2013.01); *G09G 3/3225* (2013.01); *G09G 2330/08* (2013.01); *H01L 27/3262* (2013.01)

(58) Field of Classification Search
CPC ............ H01L 27/3276; H01L 27/3262; G09G 3/3225; G09G 2330/08
See application file for complete search history.

(56) References Cited

U.S. PATENT DOCUMENTS

| | | | |
|---|---|---|---|
| 9,147,723 B1* | 9/2015 | Lee | G09G 3/006 |
| 10,199,447 B2* | 2/2019 | Jeong | H01L 27/3258 |
| 2001/0028418 A1* | 10/2001 | Ozaki | G02F 1/136286 |
| | | | 349/54 |
| 2002/0054037 A1* | 5/2002 | Kawano | G02F 1/136259 |
| | | | 345/205 |
| 2016/0049454 A1* | 2/2016 | Park | H01L 27/3276 |
| | | | 257/40 |
| 2017/0193898 A1* | 7/2017 | Lee | H01L 27/3258 |

* cited by examiner

*Primary Examiner* — Mark W Tornow
(74) *Attorney, Agent, or Firm* — Seed IP Law Group LLP

(57) ABSTRACT

A display device for increasing a repair success rate by easily cutting signal lines in a repair process of subpixels and preventing a short circuit of the signal lines is disclosed. The display device includes subpixels positioned on a first substrate, each subpixel including an emission area, in which a light emitting element is disposed, and a circuit area in which a circuit for driving the light emitting element is disposed, and a first power connection line, a sensing connection line, and at least one gate line positioned in the circuit area and connected to the subpixels. A number of stacked layers of a portion of at least one of the first power connection line and the sensing connection line is less than a number of stacked layers of the gate line.

14 Claims, 10 Drawing Sheets

DISPLAY DEVICE

CROSS-REFERENCE TO RELATED APPLICATION(S)

This application claims the priority benefit of Korean Patent Application No. 10-2017-0128228 filed on Sep. 29, 2017 which are incorporated herein by reference for all purposes as if fully set forth herein.

BACKGROUND

Technical Field

The present disclosure relates to a display device, and more particularly to a display device for increasing a repair success rate by easily cutting signal lines in a repair process of subpixels and preventing a short circuit of the signal lines.

Description of the Related Art

With the development of information society, the demands for display devices displaying an image are increasing in various ways. In a field of the display devices, a large-sized cathode ray tube (CRT) has been rapidly replaced by a flat panel display (FPD) having advantages of a thin profile, light weight, and a large-sized screen. Examples of the flat panel display include a liquid crystal display (LCD), a plasma display panel (PDP), an organic light emitting diode (OLED) display, and an electrophoresis display (EPD).

An OLED display includes self-emitting elements capable of emitting light by themselves and has advantages of a fast response time, a high emission efficiency, a high luminance, and a wide viewing angle. In particular, the OLED display can be manufactured on a flexible plastic substrate. In addition, the OLED display has advantages of a lower driving voltage, lower power consumption, and better color tone as compared to a plasma display panel or an inorganic electroluminescent display.

The OLED display may perform a repair process for repairing a defect of the component on a substrate or darkening a defective subpixel during a manufacturing process. The darkening operation for the repair process may apply a laser to a specific signal line and short-circuit the specific signal line, thereby darkening the subpixel. However, a success rate of the repair process is reduced depending on a thickness, a stacking structure, or a position of the signal line, etc., and the component of the OLED display is damaged.

BRIEF SUMMARY

The present disclosure provides a display device capable of increasing a repair success rate by easily cutting signal lines in a repair process of subpixels and preventing a short circuit of the signal lines.

In one aspect, there is provided a display device comprising subpixels positioned on a first substrate, each subpixel including an emission area, in which a light emitting element is disposed, and a circuit area in which a circuit for driving the light emitting element is disposed, and a first power connection line, a sensing connection line, and at least one gate line positioned in the circuit area and connected to the subpixels, wherein a number of stacked layers of a portion of at least one of the first power connection line and the sensing connection line is less than a number of stacked layers of the gate line.

The first power connection line is connected from a first power line to the subpixels, and the sensing connection line is connected from a sensing line to the subpixels.

Each subpixel further includes a sensing transistor positioned in the circuit area and including a gate electrode, a semiconductor layer, a source electrode, and a drain electrode. The sensing connection line is connected to the drain electrode of the sensing transistor, and the gate line is connected to the gate electrode of the sensing transistor as one body.

The gate electrode and the source electrode each have a two-layered structure at least including an upper layer and a lower layer.

The upper layer of the gate electrode and the upper layer of the source electrode are formed of the same material, and the lower layer of the gate electrode and the lower layer of the source electrode are formed of the same material.

The drain electrode, the first power connection line, and the sensing connection line each have one-layered structure.

The drain electrode, the first power connection line, and the sensing connection line are formed of the same material as the lower layer of the gate electrode and the lower layer of the source electrode.

The drain electrode, the first power connection line, and the sensing connection line each have at least one-layered structure.

The drain electrode has a two-layered structure including an upper layer and a lower layer. At least one of the first power connection line or the sensing connection line has one-layered structure in a repair portion and has a two-layered structure in an area except the repair portion.

The first power connection line and the sensing connection line each have one-layered structure including a lower layer and have a two-layered structure including an upper layer and a lower layer.

The lower layer of each of the drain electrode, the first power connection line, and the sensing connection line is formed of the same material as the lower layer of the gate electrode. The upper layer of each of the drain electrode, the first power connection line, and the sensing connection line is formed of the same material as the upper layer of the gate electrode.

BRIEF DESCRIPTION OF THE SEVERAL VIEWS OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the disclosure. Names of the respective elements used in the following explanations are selected only for convenience of writing the specification and may be thus different from those used in actual products. In the description of positional relationships, when a structure is described as being positioned "on or above", "under or below", "next to" another structure, this description should be construed as including a case in which the structures directly contact each other as well as a case in which a third structure is disposed therebetween.

A display device according to embodiments of the disclosure is a display device in which a display element is formed on a glass substrate or a flexible substrate. Examples of the display device include an organic light emitting diode (OLED) display, a liquid crystal display (LCD), and an electrophoresis display. Embodiments of the disclosure are described using the OLED display by way of example. An OLED display includes an organic layer which is formed between a first electrode serving as an anode and a second electrode serving as a cathode using an organic material. The OLED display is a self-emission display configured to form hole-electron pairs, i.e., excitons, by combining holes received from the first electrode and electrons received from the second electrode inside the organic layer and emit light by energy generated when the excitons return to a ground level.

Figure 1:
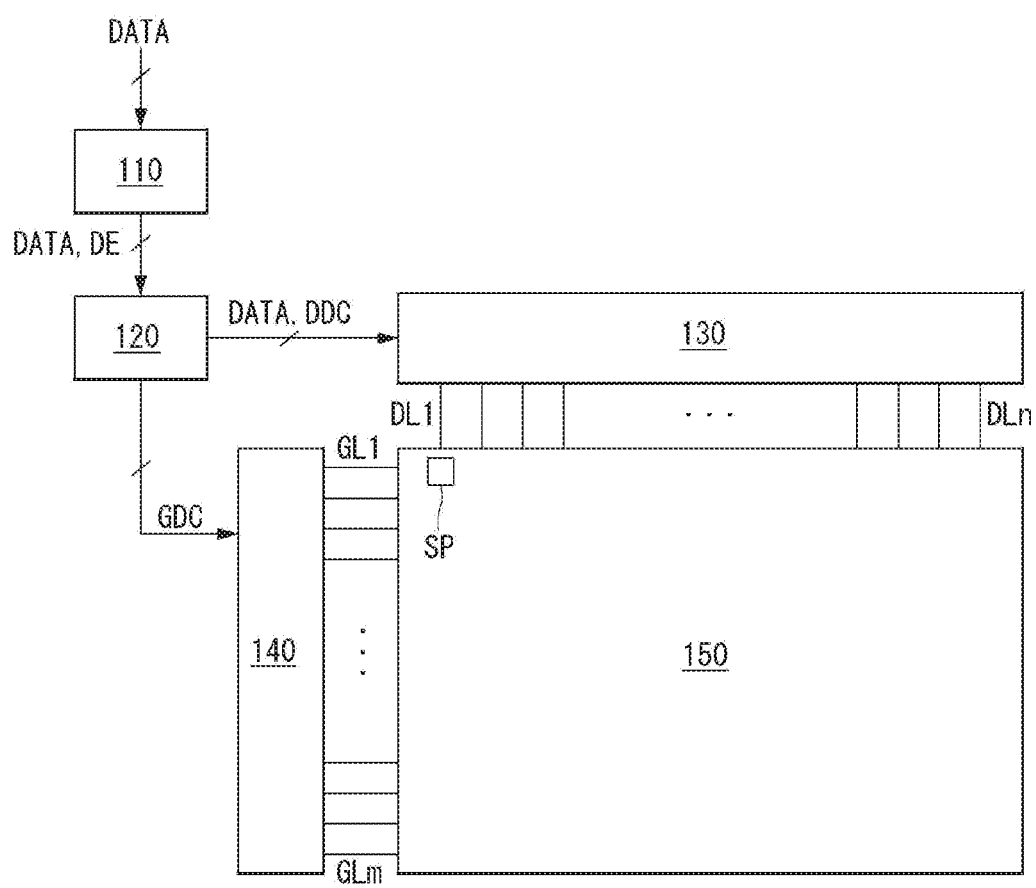
FIG. 1 is a schematic block diagram of an organic light emitting diode (OLED) display according to an embodiment of the disclosure.
Figure 2:
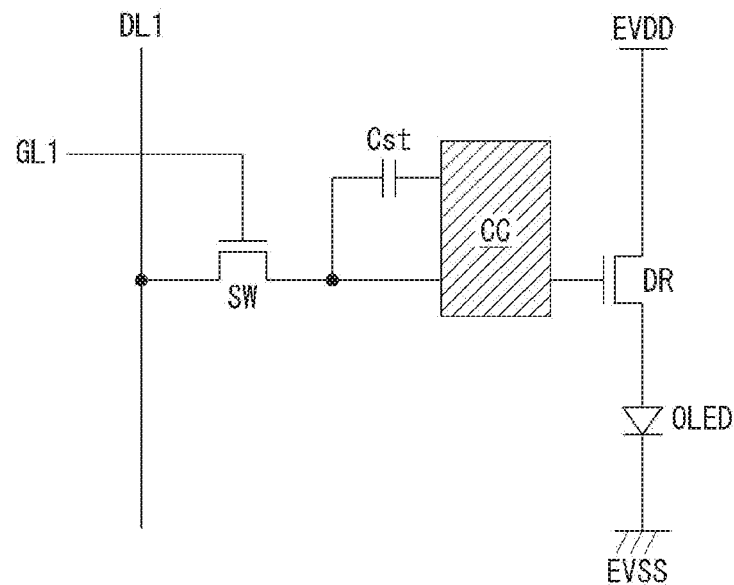
FIG. 2 schematically illustrates a circuit configuration of a subpixel.
Figure 3:
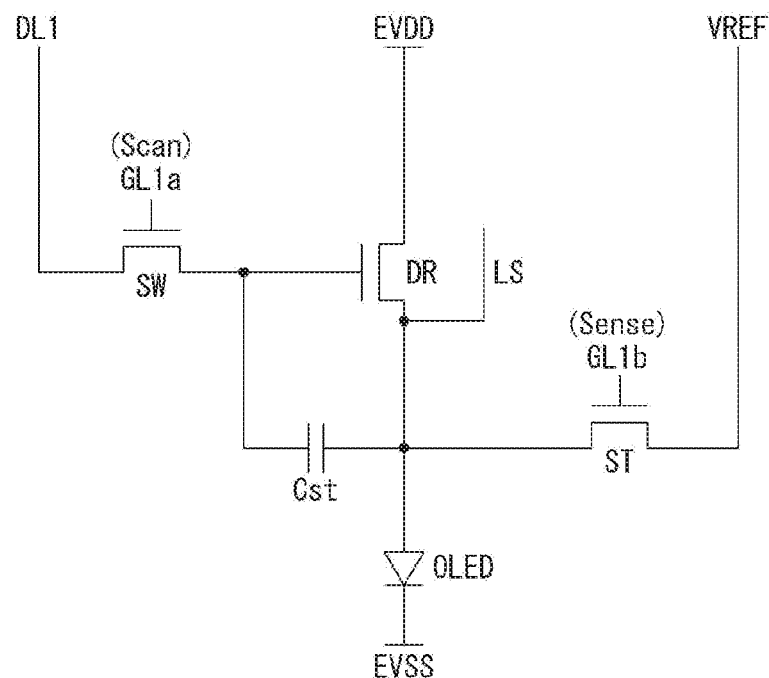
FIG. 3 illustrates in detail a circuit configuration of a subpixel.
Figure 4:
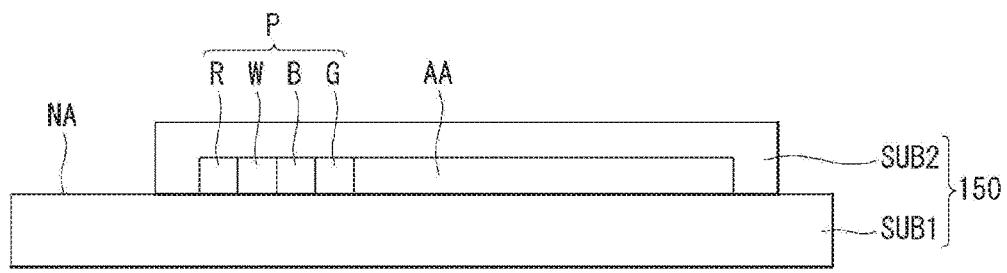
FIG. 4 illustrates an example of a cross-sectional view of a display panel.

FIG. 1 is a schematic block diagram of an OLED display according to an embodiment of the disclosure. FIG. 2 schematically illustrates a circuit configuration of a subpixel. FIG. 3 illustrates in detail a circuit configuration of a subpixel. FIG. 4 illustrates an example of a cross-sectional view of a display panel.

As shown in FIG. 1, an OLED display according to an embodiment of the disclosure may include an image processing unit 110, a timing controller 120, a data driver 130, a scan driver 140, and a display panel 150.

The image processing unit 110 outputs a data signal DATA, a data enable signal DE, etc. supplied from the outside. The image processing unit 110 may output one or more of a vertical sync signal, a horizontal sync signal, and a clock signal in addition to the data enable signal DE. These signals are not shown for convenience of explanation.

The timing controller 120 receives the data signal DATA and driving signals including the data enable signal DE, the vertical sync signal, the horizontal sync signal, the clock signal, etc. from the image processing unit 110. The timing controller 120 outputs a gate timing control signal GDC for controlling operation timing of the scan driver 140 and a data timing control signal DDC for controlling the operation timing of the data driver 130 based on the driving signals.

The data driver 130 samples and latches the data signal DATA received from the timing controller 120 in response to the data timing control signal DDC received from the timing controller 120 and converts the latched data signal DATA into a gamma reference voltage to output the gamma reference voltage. The data driver 130 outputs the data signal DATA to data lines DL1 to DLn. The data driver 130 may be formed as an integrated circuit (IC).

The scan driver 140 outputs a scan signal in response to the gate timing control signal GDC supplied from the timing controller 120. The scan driver 140 outputs the scan signal to gate lines GL1 to GLm. The scan driver 140 may be formed as an IC or formed on the display panel 150 in a gate-in-panel (GIP) manner.

The display panel 150 displays an image in response to the data signal DATA and the scan signal respectively received from the data driver 130 and the scan driver 140. The display panel 150 includes subpixels SP configured to display an image.

The subpixels SP may include red subpixels, green subpixels, and blue subpixels, or may include white subpixels, red subpixels, green subpixels, and blue subpixels. Further, one or more of the subpixels SP may have different emission areas depending on emission characteristics.

As shown in FIG. 2, each subpixel may include a switching transistor SW, a driving transistor DR, a capacitor Cst, a compensation circuit CC, and an organic light emitting diode OLED.

The switching transistor SW performs a switching operation so that a data signal supplied through a first data line DL1 is stored in the capacitor Cst as a data voltage in response to a scan signal supplied through a first gate line GL1. The driving transistor DR enables a driving current to flow between a first power line (or referred to as "high potential power line") EVDD and a second power line (or referred to as "low potential power line") EVSS depending on the data voltage stored in the capacitor Cst. The organic light emitting diode OLED emits light with the driving current provided by the driving transistor DR.

The compensation circuit CC is added to the subpixel and compensates for a characteristic including a threshold voltage, etc. of the driving transistor DR. The compensation circuit CC includes one or more transistors. Configuration of the compensation circuit CC may be variously changed in accordance with various embodiments, depending on an external compensation method and is described below with reference to FIG. 3.

As shown in FIG. 3, the compensation circuit CC may include a sensing transistor ST and a sensing line (or referred to as "reference line") VREF. The sensing transistor ST is connected between the sensing line VREF and a node (hereinafter referred to as "sensing node") that is electrically coupled to a source electrode of the driving transistor DR and to an anode electrode of the organic light emitting diode OLED. The sensing transistor ST may supply a sensing voltage (or referred to as "initialization voltage") transmitted through the sensing line VREF to the sensing node of the driving transistor DR, or may sense a voltage or a current of the sensing node of the driving transistor DR or a voltage or a current of the sensing line VREF.

A first electrode of the switching transistor SW is connected to the first data line DL1, and a second electrode of the switching transistor SW is connected to a gate electrode of the driving transistor DR. A first electrode of the driving transistor DR is connected to the first power line EVDD, and a second electrode of the driving transistor DR is connected to the anode electrode of the organic light emitting diode OLED. A first electrode of the capacitor Cst is connected to the gate electrode of the driving transistor DR, and a second electrode of the capacitor Cst is connected to the anode electrode of the organic light emitting diode OLED. The anode electrode of the organic light emitting diode OLED is connected to the second electrode of the driving transistor DR, and a cathode electrode of the organic light emitting diode OLED is connected to the second power line EVSS. A first electrode of the sensing transistor ST is connected to the sensing line VREF, and a second electrode of the sensing transistor ST is connected to the sensing node, i.e., the anode electrode of the organic light emitting diode OLED and the second electrode of the driving transistor DR.

An operation time of the sensing transistor ST may be similar to (or the same as) or different from an operation time of the switching transistor SW depending on an external compensation algorithm (or depending on a configuration of the compensation circuit). For example, a gate electrode of the switching transistor SW may be connected to a first gate line GL1a, and a gate electrode of the sensing transistor ST may be connected to a second gate line GL1b. In this instance, a scan signal (Scan) may be transmitted to the first gate line GL1a, and a sensing signal (Sense) may be transmitted to the second gate line GL1b. As another example, the gate electrode of the switching transistor SW and the gate electrode of the sensing transistor ST may share the first gate line GL1a or the second gate line GL1b, and thus the gate electrodes of the switching transistor SW and the sensing transistor ST may be connected.

The sensing line VREF may be connected to the data driver, e.g., the data driver 130 shown in FIG. 1. In this instance, the data driver may sense the sensing node of the subpixel during a non-display period of a real-time image or N frame period and may generate a result of the sensing, where N is an integer equal to or greater than 1. The switching transistor SW and the sensing transistor ST may be turned on at the same time. In such a case, a sensing operation using the sensing line VREF and a data output operation outputting the data signal are separated (or distinguished) from each other in accordance with a time-division driving method of the data driver.

In addition, a compensation target according to the sensing result may be a digital data signal, an analog data signal, a gamma signal, or the like. The compensation circuit for generating a compensation signal (or a compensation voltage) based on the sensing result may be implemented inside the data driver, inside the timing controller, or as a separate circuit.

A light shielding layer LS may be disposed only below a channel region of the driving transistor DR. Alternatively, the light shielding layer LS may be disposed below the channel region of the driving transistor DR and below channel regions of the switching transistor SW and the sensing transistor ST. The light shielding layer LS may be simply used for shielding external light. In addition, the light shielding layer LS may be connected to another electrode or another line and used as an electrode constituting the capacitor, etc. Therefore, the light shielding layer LS may be provided as a multilayer element formed of metal (for example, a multilayer of different metals), so as to have light shielding characteristics.

FIG. 3 illustrates the subpixel having a 3T(Transistor)1C (Capacitor) configuration, including the switching transistor SW, the driving transistor DR, the capacitor Cst, the organic light emitting diode OLED, and the sensing transistor ST, by way of example. However, when the compensation circuit CC is added to the subpixel, the subpixel may have various configurations such as 3T2C, 4T2C, 5T1C, and 6T2C.

As shown in FIG. 4, subpixels are formed on a display area AA of a first substrate (or referred to as "thin film transistor substrate") SUB1, and each subpixel may have the circuit structure illustrated in FIG. 3. The subpixels on the display area AA are sealed by a protective film (or referred to as "protective substrate") SUB2. In FIG. 4, a reference numeral "NA" denotes a non-display area of the display panel 150. The first substrate SUB1 may be formed of a rigid or semi-rigid material such as glass, or it may be formed of a flexible material.

The subpixels are arranged on a surface of the first substrate SUB1, and may be horizontally or vertically arranged in order of red (R), white (W), blue (B), and green (G) subpixels on the display area AA, depending on an orientation of the first substrate SUB1. The red (R), white (W), blue (B), and green (G) subpixels together form one pixel P. However, embodiments are not limited thereto. For example, the arrangement order of the subpixels may be variously changed depending on an emission material, an emission area, configuration (or structure) of the compensation circuit, and the like. Further, the red (R), blue (B), and green (G) subpixels may form one pixel P.

Figure 5:
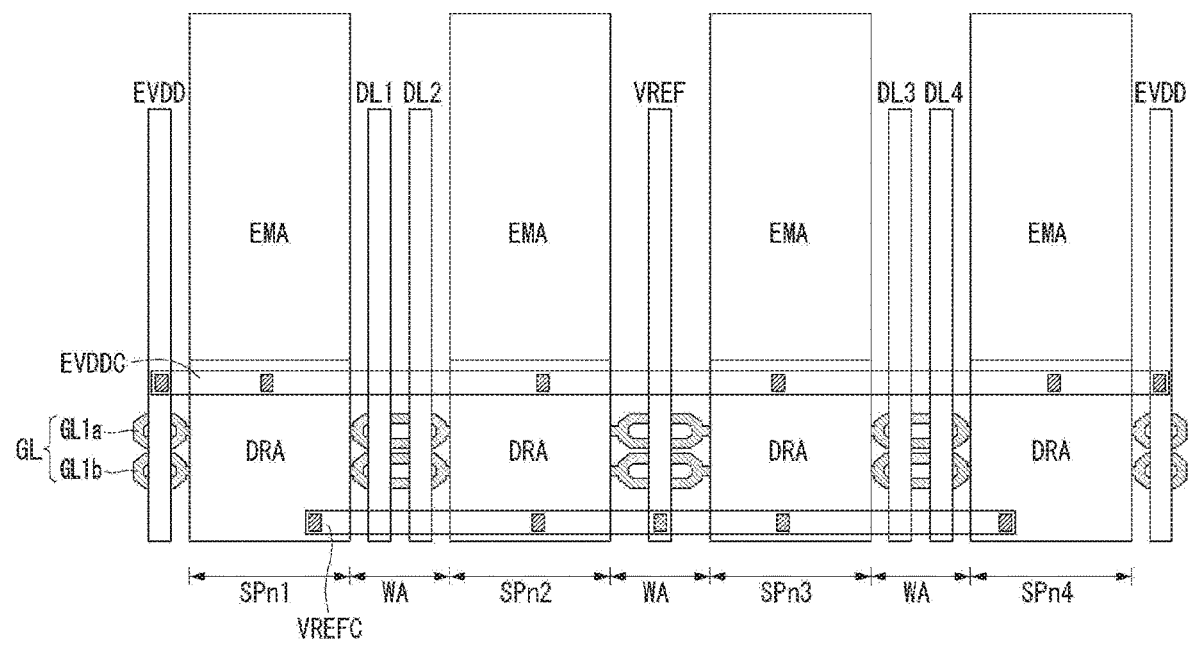
FIG. 5 schematically illustrates a planar layout of subpixels according to an embodiment of the disclosure.
Figure 6:
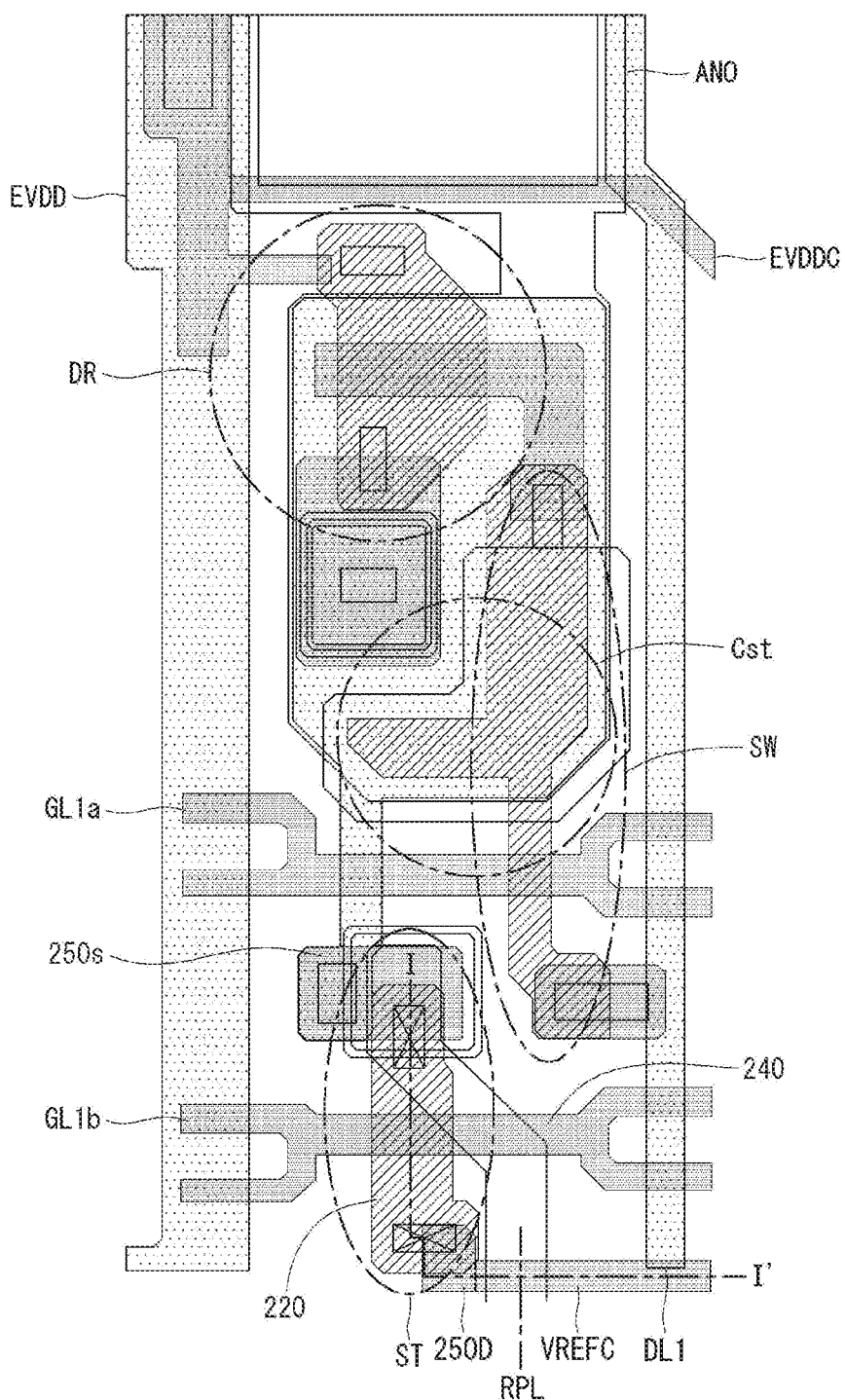
FIG. 6 illustrates in detail a circuit area of FIG. 5 according to an embodiment of the disclosure.
Figure 7:
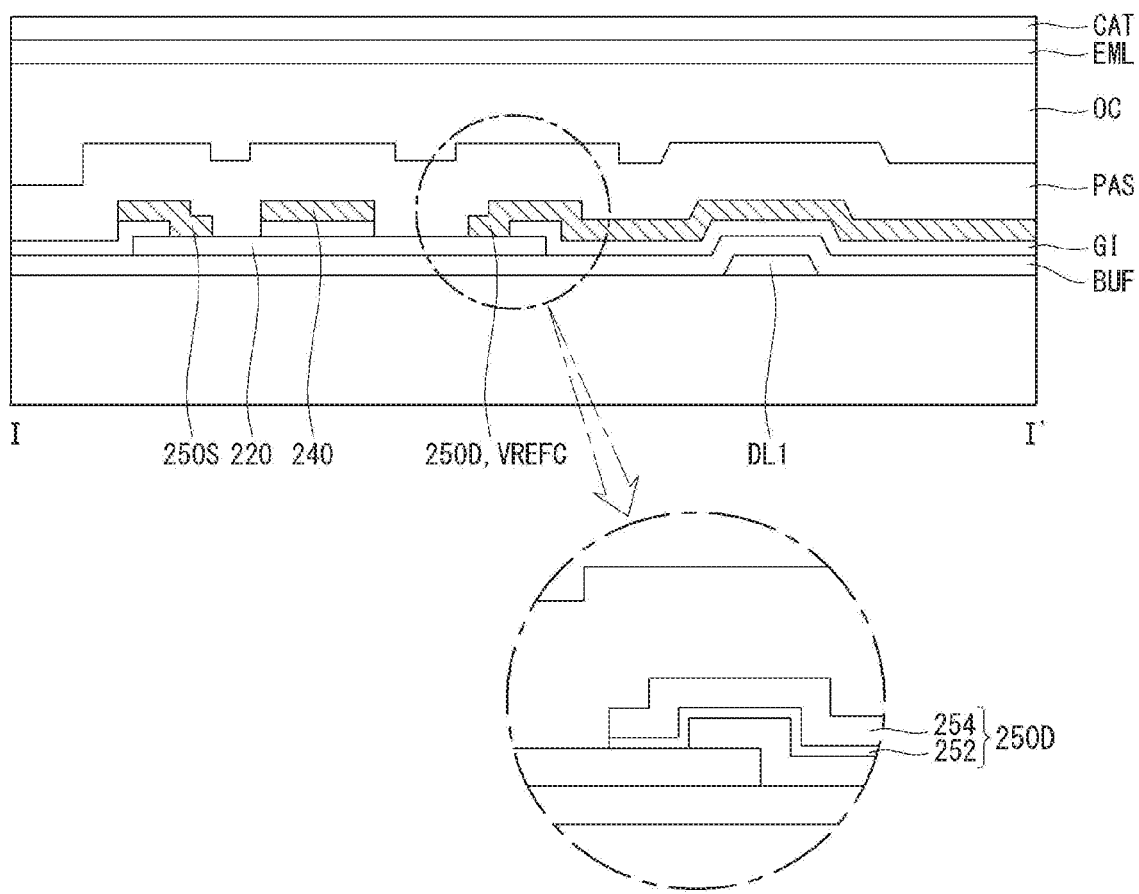
FIG. 7 is a cross-sectional view taken along line I-I' of FIG. 6.

FIG. 5 schematically illustrates a planar layout of subpixels according to an embodiment of the disclosure. FIG. 6 illustrates in detail a circuit area of FIG. 5 according to an embodiment of the disclosure. FIG. 7 is a cross-sectional view taken along line I-I' of FIG. 6.

As shown in FIGS. 4 and 5, first to fourth subpixels SPn1 to SPn4 each having an emission area EMA and a circuit area DRA are formed on the display area AA of the first substrate SUB1. An organic light emitting diode (or a light emitting element) is formed in the emission area EMA, and a circuit including a switching transistor, a sensing transistor, a driving transistor, etc., for driving the organic light emitting diode is formed in the circuit area DRA. In the first to fourth subpixels SPn1 to SPn4, the organic light emitting diode in the emission area EMA emits light according to an operation of the switching transistor and the driving transistor in the circuit area DRA. A line area WA is provided in areas adjacent to sides of each of the first to fourth subpixels SPn1 to SPn4. Namely, the line area WA may be a composite area that includes all of the areas between respective subpixels. A first power line EVDD, a sensing line VREF, and first to fourth data lines DL1 to DL4 are disposed in the line area WA. First and second gate lines GL1a and GL1b are disposed across the first to fourth subpixels SPn1 to SPn4.

The lines, such as the first power line EVDD, the sensing line VREF, and the first to fourth data lines DL1 to DL4, and electrodes constituting a thin film transistor are positioned on different layers, but are electrically connected to each other through contact holes (or via holes). The sensing line VREF is connected to a sensing transistor (not shown) of each of the first to fourth subpixels SPn1 to SPn4 through a sensing connection line VREFC. The first power line EVDD is connected to a driving transistor (not shown) of each of the first to fourth subpixels SPn1 to SPn4 through a first power connection line EVDDC. The first and second gate lines GL1a and GL1b are connected to the sensing transistor and the driving transistor of each of the first to fourth subpixels SPn1 to SPn4.

With reference to FIG. 6, a structure of the first subpixel SPn1 is described as an example.

Referring to FIGS. 5 and 6, the first subpixel SPn1 is defined as a crossing of the first and second gate lines GL1a and GL1b and the first data line DL1. The first subpixel SPn1 includes a driving transistor DR, a sensing transistor ST, a switching transistor SW, a capacitor Cst, and an organic light emitting diode OLED.

A first electrode ANO of the organic light emitting diode OLED is disposed in the emission area EMA, and the driving transistor DR, the capacitor Cst, the sensing transistor ST, and the switching transistor SW are disposed in the circuit area DRA. In particular, the sensing transistor ST includes a gate electrode 240, a drain electrode 250D, a source electrode 250S, and a semiconductor layer 220. The drain electrode 250D of the sensing transistor ST is integrated with the sensing connection line VREFC connected from the sensing line VREF shown in FIG. 5.

In each subpixel shown in FIG. 6, lines arranged in a horizontal direction, for example, the first and second gate lines GL1a and GL1b, the sensing connection line VREFC, and the first power connection line EVDDC may be made of a gate electrode material. Further, lines arranged in a vertical direction, for example, the first data line DL1 and the first power line EVDD may be made of a light shielding material.

Referring to FIG. 7 illustrating a cross-sectional structure of the sensing transistor ST and the sensing connection line VREFC, the first data line DL1 made of the light shielding material is disposed on the first substrate SUB1, and a buffer layer BUF is disposed on the first data line DL1. The semiconductor layer 220 is disposed on the buffer layer BUF, and a gate insulating layer GI is disposed on the semiconductor layer 220. The gate electrode 240, the source electrode 250S, the drain electrode 250D, and the sensing connection line VREFC integrated with the drain electrode 250D are disposed on the gate insulating layer GI. The gate electrode 240, the semiconductor layer 220, the source electrode 250S, and the drain electrode 250D constitute the sensing transistor ST. A passivation layer PAS and an overcoat layer OC are disposed on the sensing transistor ST, and an organic layer EML and a second electrode CAT serving as a cathode electrode are disposed on the overcoat layer OC.

In a process for manufacturing a display panel having a structure shown in FIGS. 6 and 7, a repair process may be performed to repair a defect of the component on a first substrate or darken a defective subpixel. For example, a repair portion RPL of the first power connection line EVDDC or the sensing connection line VREFC arranged in the horizontal direction may be laser cut in the repair process. In this instance, the first power connection line EVDDC and the sensing connection line VREFC are configured in the same structure as the gate electrode using the same material as the gate electrode. More specifically, the first power connection line EVDDC and the sensing connection line VREFC each have a two-layered structure including an upper copper (Cu) layer 254 and a lower molybdenum titanium (MoTi) layer 252 underlying the Cu layer 254. While the lower MoTi layer 252 is thin with a thickness of 100 Å to 1,500 Å, the upper Cu layer 254 having low resistance characteristics is thick with a thickness of 2,000 Å to 4,000 Å. Thus, because it is very difficult to laser cut the thick Cu layer 254 through the laser irradiation, a success rate of the repair process is reduced. Further, when a large amount of laser is irradiated onto the thick Cu layer 254, copper flowing out of the Cu layer 254 due to a high temperature may contact the second electrode CAT positioned on the Cu layer 254, thereby generating a short circuit.

Hereinafter, examples capable of increasing a repair success rate of an OLED display according to an embodiment of the disclosure and preventing a bad short circuit will be described.

Embodiment

Figure 8:
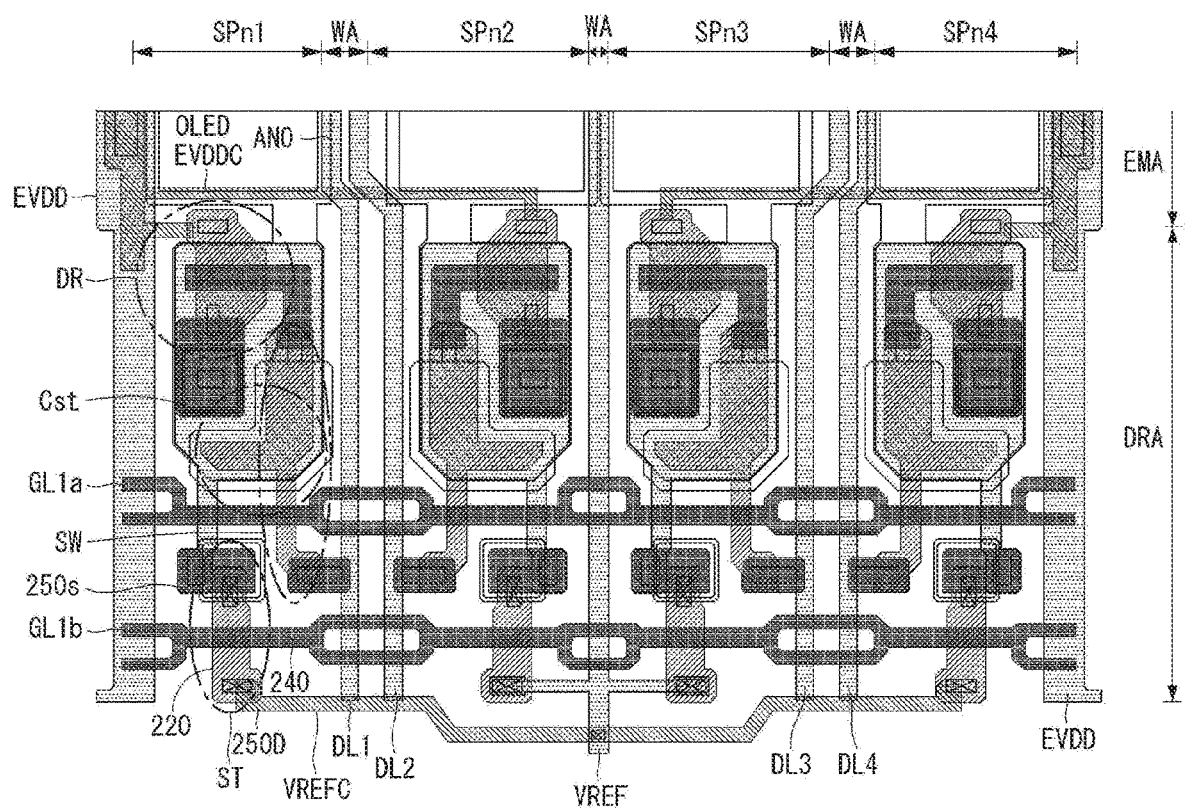
FIG. 8 schematically illustrates a planar layout of subpixels according to an embodiment of the disclosure.
Figure 9:
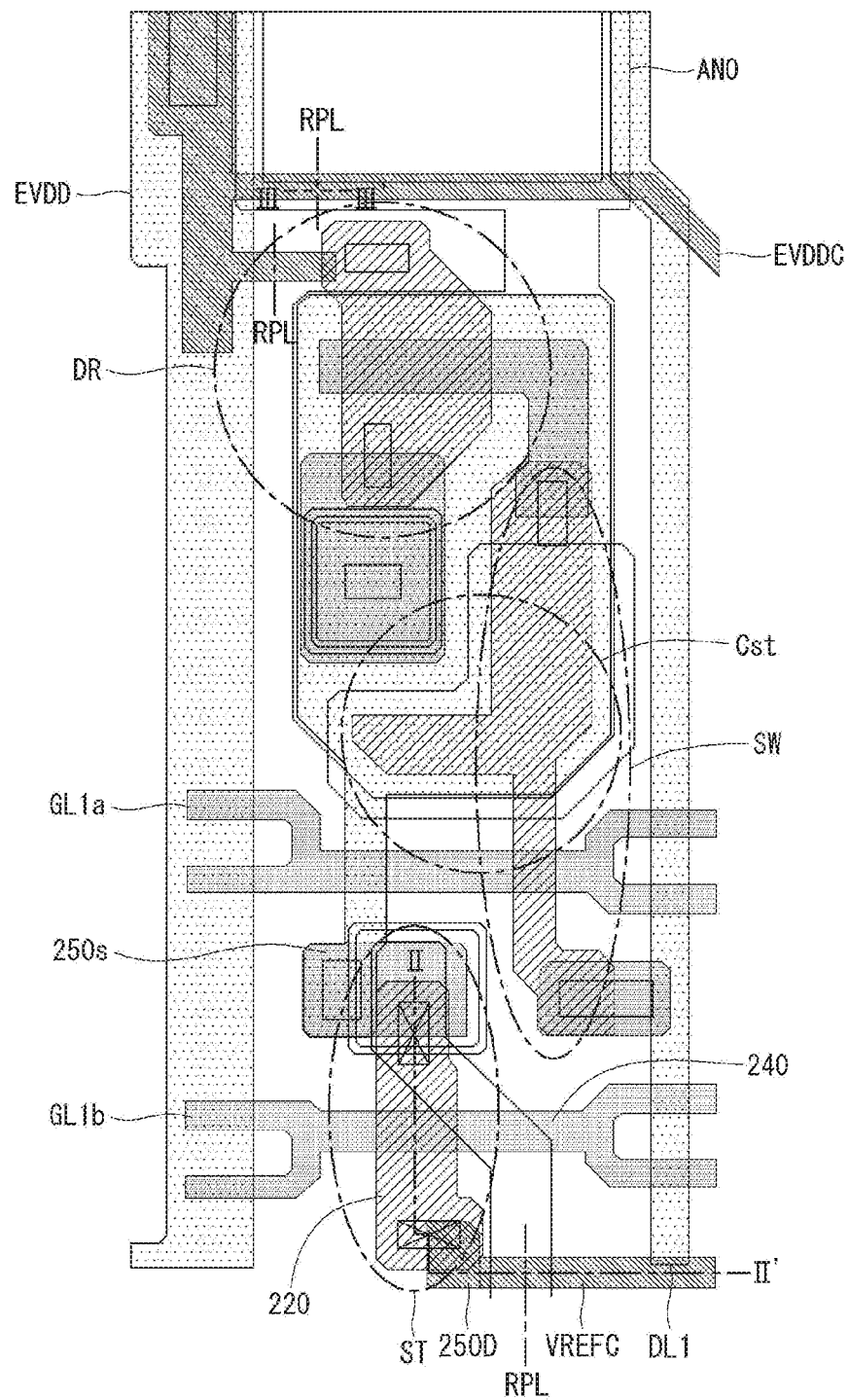
FIG. 9 is a plan view of a first subpixel according to an embodiment of the disclosure.
Figure 10:
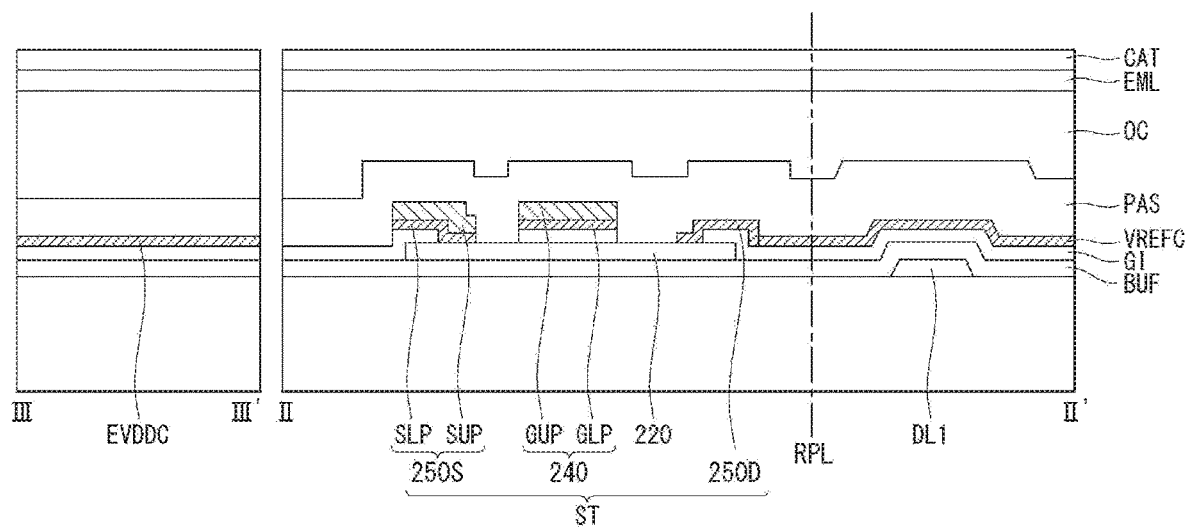
FIG. 10 is a cross-sectional view taken along lines II-II' and III-III' of FIG. 9.
Figure 11:
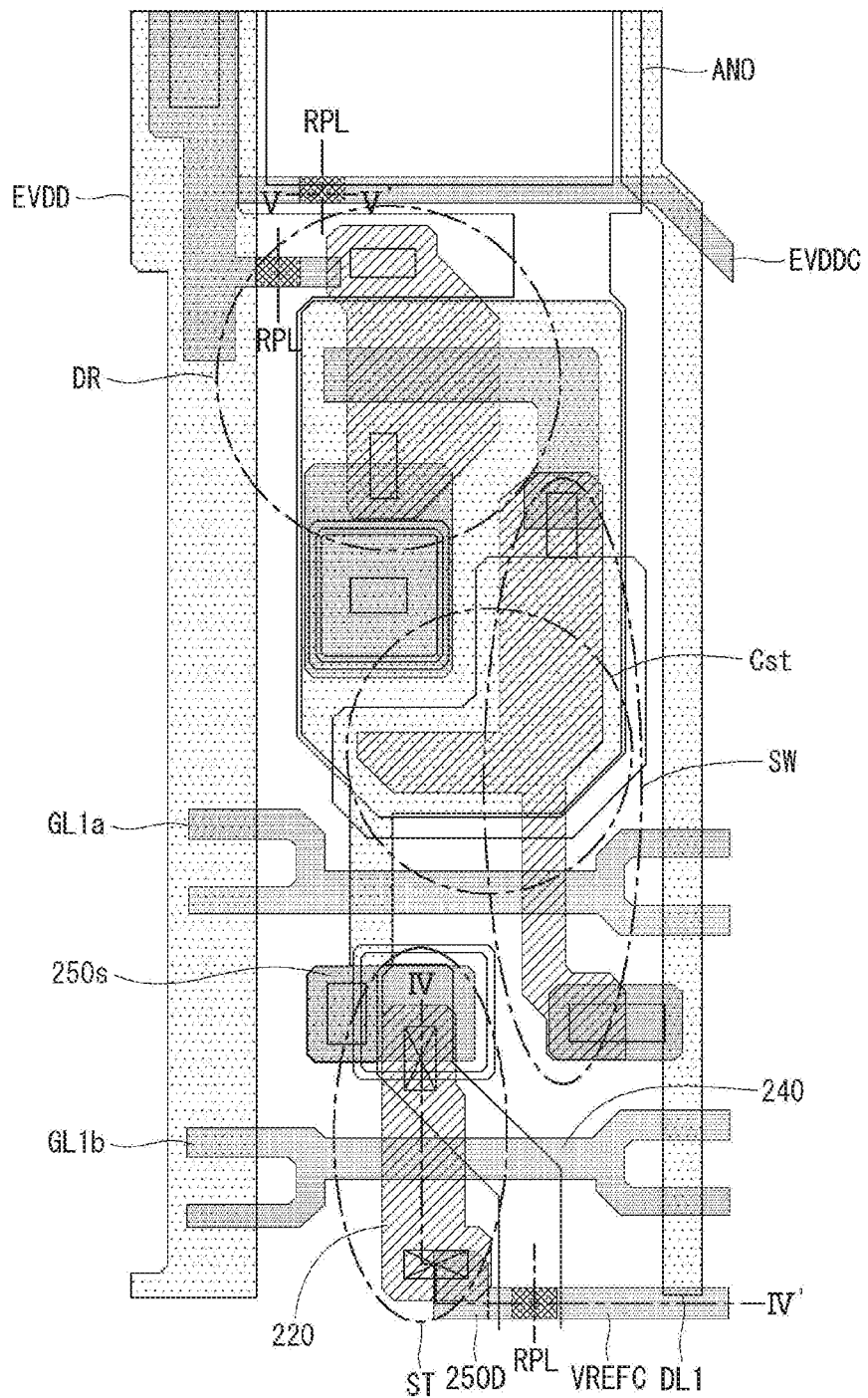
FIG. 11 is a plan view of a first subpixel according to another embodiment of the disclosure.
Figure 12:
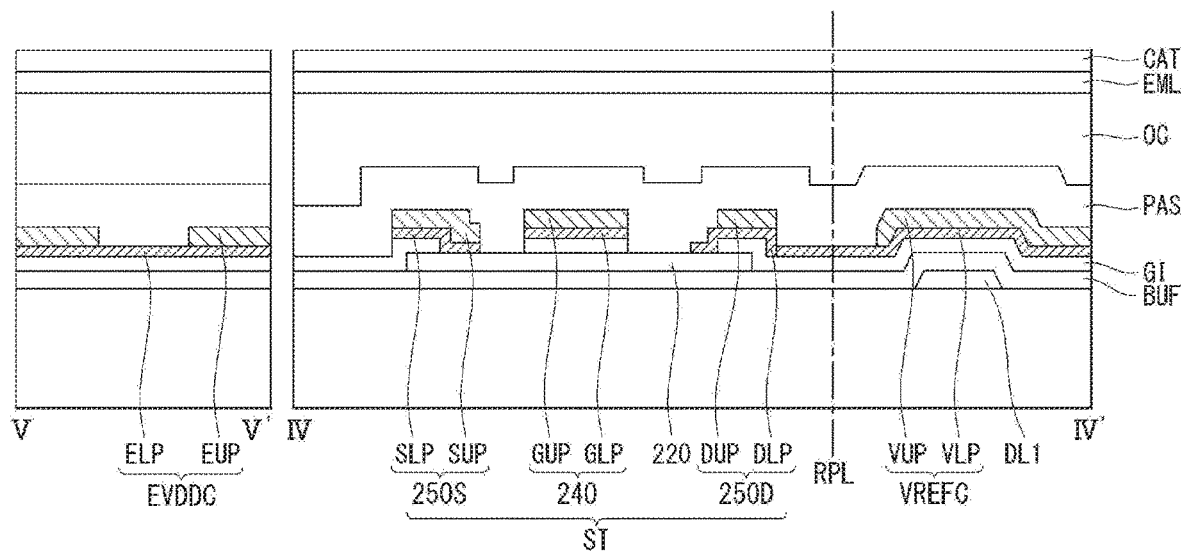
FIG. 12 is a cross-sectional view taken along lines IV-IV' and V-V' of FIG. 11.

FIG. 8 schematically illustrates a planar layout of subpixels according to an embodiment of the disclosure. FIG. 9 is a plan view of a first subpixel according to an embodiment of the disclosure. FIG. 10 is a cross-sectional view taken along lines II-II' and III-III' of FIG. 9. FIG. 11 is a plan view of a first subpixel according to another embodiment of the disclosure. FIG. 12 is a cross-sectional view taken along lines IV-IV' and V-V' of FIG. 11.

Referring to FIG. 8, an OLED display according to an embodiment of the disclosure defines first to fourth subpixels SPn1 to SPn4 by a crossing of first and second gate lines GL1a and GL1b and first to fourth data lines DL1 to DL4. More specifically, the first to fourth subpixels SPn1 to SPn4 respectively connected to the first to fourth data lines DL1 to DL4 are commonly connected to a sensing line VREF. The sensing line VREF is directly connected to the second and third subpixels SPn2 and SPn3 and is connected to the first and fourth subpixels SPn1 and SPn4 through a sensing connection line VREFC. A first power line EVDD is disposed at one edge of each of the first and fourth subpixels SPn1 and SPn4. More specifically, the first power lines EVDD are directly connected to the first and fourth subpixels SPn1 and SPn4 respectively adjacent to the first power lines EVDD and are connected to the second and third subpixels SPn2 and SPn3 through a first power connection line EVDDC.

A first electrode ANO of an organic light emitting diode OLED is disposed in an emission area EMA of each of the first to fourth subpixels SPn1 to SPn4, and a driving transistor DR, a capacitor Cst, a sensing transistor ST, and a switching transistor SW are disposed in a circuit area DRA of each of the first to fourth subpixels SPn1 to SPn4. In particular, the sensing transistor ST includes a gate electrode 240, a drain electrode 250D, a source electrode 250S, and a semiconductor layer 220. The drain electrode 250D of the sensing transistor ST is integrated with the sensing connection line VREFC connected from the sensing line VREF. The first power lines EVDD are connected to the driving transistors DR of the first to fourth subpixels SPn1 to SPn4 through the first power connection line EVDDC. The first power lines EVDD are connected to each driving transistor DR of the first through fourth sub-pixels SPn1 through SPn4 through the first power connection line EVDDC. The first and second gate lines GL1a and GL1b are connected to the sensing transistor ST and the driving transistor SW of each of the first to fourth subpixels SPn1 to SPn4.

With reference to FIGS. 8 and 9, a structure of the first subpixel SPn1 is described as an example.

Referring to FIGS. 8 and 9, the first subpixel SPn1 is defined as a crossing of the first and second gate lines GL1a and GL1b and the first data line DL1. The first subpixel SPn1 includes a driving transistor DR, a sensing transistor ST, a switching transistor SW, a capacitor Cst, and an organic light emitting diode OLED.

A first electrode ANO of the organic light emitting diode OLED is disposed in an emission area EMA of the first subpixel SPn1, and the driving transistor DR, the capacitor Cst, the sensing transistor ST, and the switching transistor SW are disposed in a circuit area DRA of the first subpixel SPn1. In particular, the sensing transistor ST includes a gate electrode 240, a drain electrode 250D, a source electrode 250S, and a semiconductor layer 220. The drain electrode 250D of the sensing transistor ST is integrated with the sensing connection line VREFC connected from the sensing line VREF.

In the embodiment of the disclosure, lines arranged in a horizontal direction, for example, the first and second gate lines GL1a and GL1b, the sensing connection line VREFC, and the first power connection line EVDDC may be made of a gate electrode material. Further, lines arranged in a vertical direction, for example, the first data line DL1 and the first power line EVDD may be made of a light shielding material.

In embodiments disclosed herein, the number of stacked layers of a portion of at least one of the first power connection line EVDDC and the sensing connection line VREFC is less than the number of stacked layers of each of the first and second gate lines GL1a and GL1b. More specifically, the first and second gate lines GL1a and GL1b each have at least two-layered structure, and portions of the first power connection line EVDDC and the sensing connection line VREFC each have one-layered structure.

Referring to FIG. 10, the first data line DL1 made of the light shielding material is disposed on a first substrate SUB1 (see FIG. 4), and a buffer layer BUF is disposed on the first data line DL1. The semiconductor layer 220 is disposed on the buffer layer BUF, and a gate insulating layer GI is disposed on the semiconductor layer 220. The gate electrode 240, the source electrode 250S, the drain electrode 250D, and the sensing connection line VREFC integrated with the drain electrode 250D are disposed on the gate insulating layer GI. The gate electrode 240, the semiconductor layer 220, the source electrode 250S, and the drain electrode 250D constitute the sensing transistor ST. The first power connection line EVDDC is disposed on the gate insulating layer GI, and thus the gate insulating layer GI is spaced from the gate electrode 240, the source electrode 250S, and the drain electrode 250D. A passivation layer PAS and an overcoat layer OC are disposed on the sensing transistor ST and the first power connection line EVDDC, and an organic layer EML and a second electrode CAT serving as a cathode electrode are disposed on the overcoat layer OC.

In embodiments disclosed herein, the gate electrode 240 has a two-layered structure including an upper gate layer GUP and a lower gate layer GLP, and the source electrode 250S has a two-layered structure including an upper source layer SUP and a lower source layer SLP. Namely, the gate electrode 240 and the source electrode 250S have the same structure. Although not shown, the first and second gate lines GL1a and GL1b have the same structure as the gate electrode 240. Thus, the upper gate layer GUP and the upper source layer SUP are formed of the same material, and the lower gate layer GLP and the lower source layer SLP are formed of the same material. The upper gate layer GUP and the upper source layer SUP may be formed of a low resistance metal, for example, copper (Cu) and may have a thickness of 2,000 Å to 4,000 Å.

On the other hand, the drain electrode 250D, the sensing connection line VREFC, and the first power connection line EVDDC each have one-layered structure. The drain electrode 250D, the sensing connection line VREFC, and the first power connection line EVDDC are configured in a two-layered structure when the gate electrode 240 and the source electrode 250S are manufactured, but an etching process is performed to remove a thick Cu layer of each of the drain electrode 250D, the sensing connection line VREFC, and the first power connection line EVDDC. As a result, they each have one-layered structure. The drain electrode 250D, the sensing connection line VREFC, and the first power connection line EVDDC may be formed of the same material as the lower gate layer GLP and the lower source layer SLP.

The lower gate layer GLP, the lower source layer SLP, the drain electrode 250D, the sensing connection line VREFC, and the first power connection line EVDDC may be formed of aluminum (Al), molybdenum (Mo), nickel (Ni), gold (Au), chrome (Cr), titanium (Ti), silver (Ag), magnesium (Mg), or an alloy thereof, and a transparent metal oxide layer such as indium tin oxide (ITO) or indium zinc oxide (IZO). Preferably, they may be formed of molybdenum titanium (MoTi). The lower gate layer GLP, the lower source layer SLP, the drain electrode 250D, the sensing connection line VREFC, and the first power connection line EVDDC may have a thickness of 100 Å to 1,500 Å. Namely, the drain electrode 250D, the sensing connection line VREFC, and the first power connection line EVDDC are formed thin with a thickness of 100 Å to 1,500 Å.

In the embodiment of the disclosure, each of the sensing connection line VREFC and the first power connection line EVDDC is configured in one-layered structure and thus is formed thin. Hence, because a repair portion RPL, on which a repair process will be performed, are formed thin in the sensing connection line VREFC and the first power connection line EVDDC, the repair portions RPL of the sensing connection line VREFC and the first power connection line EVDDC can be easily cut through the laser irradiation in the repair process. As a result, a success rate of the repair process can increase.

Further, because the sensing connection line VREFC and the first power connection line EVDDC do not have the thick Cu layer, copper does not flow out of them due to the laser irradiation. As a result, a short circuit between the second electrode CAT and the sensing connection line VREFC and the first power connection line EVDDC can be prevented.

With reference to FIGS. 11 and 12, a structure of a subpixel according to another embodiment of the disclosure is described.

Referring to FIG. 11, a first subpixel SPn1 is defined as a crossing of first and second gate lines GL1a and GL1b and a first data line DL1. The first subpixel SPn1 includes a driving transistor DR, a sensing transistor ST, a switching transistor SW, a capacitor Cst, and an organic light emitting diode OLED.

A first electrode ANO of the organic light emitting diode OLED is disposed in an emission area EMA of the first subpixel SPn1, and the driving transistor DR, the capacitor Cst, the sensing transistor ST, and the switching transistor SW are disposed in a circuit area DRA of the first subpixel SPn1. In particular, the sensing transistor ST includes a gate electrode 240, a drain electrode 250D, a source electrode 250S, and a semiconductor layer 220. The drain electrode 250D of the sensing transistor ST is integrated with a sensing connection line VREFC connected from a sensing line VREF.

In the embodiment of the disclosure, lines arranged in a horizontal direction, for example, the first and second gate lines GL1a and GL1b, the sensing connection line VREFC, and the first power connection line EVDDC may be made of a gate electrode material. Further, lines arranged in a vertical direction, for example, the first data line DL1 and a first power line EVDD may be made of a light shielding material.

The first and second gate lines GL1a and GL1b each have at least two-layered structure. In particular, the sensing connection line VREFC and the first power connection line EVDDC each have a two-layered structure, but have one-layered structure in a partial area thereof. In embodiments disclosed herein, the partial area may be a repair portion RPL on which a laser cutting operation will be performed in a repair process. Namely, the sensing connection line VREFC and the first power connection line EVDDC according to the embodiment of the disclosure have the two-layered structure, but may have one-layered structure in the repair portion RPL. The repair portion RPL may be positioned anywhere as long as the sensing connection line VREFC and the first power connection line EVDDC are a path connected to each subpixel.

More specifically, referring to FIG. 12, the first data line DL1 made of the light shielding material is disposed on a first substrate SUB1 (see FIG. 4), and a buffer layer BUF is disposed on the first data line DL1. The semiconductor layer 220 is disposed on the buffer layer BUF, and a gate insulating layer GI is disposed on the semiconductor layer 220. The gate electrode 240, the source electrode 250S, the drain electrode 250D, and the sensing connection line VREFC integrated with the drain electrode 250D are disposed on the gate insulating layer GI. The gate electrode 240, the semiconductor layer 220, the source electrode 250S, and the drain electrode 250D constitute the sensing transistor ST. The first power connection line EVDDC is disposed on the gate insulating layer GI spaced from the gate electrode 240, the source electrode 250S, and the drain electrode 250D. A passivation layer PAS and an overcoat layer OC are disposed on the sensing transistor ST and the first power connection line EVDDC, and an organic layer EML and a second electrode CAT serving as a cathode electrode are disposed on the overcoat layer OC.

The gate electrode 240 has a two-layered structure including an upper gate layer GUP and a lower gate layer GLP, and the source electrode 250S has a two-layered structure including an upper source layer SUP and a lower source layer SLP. Unlike FIG. 10, the drain electrode 250D has a two-layered structure including an upper drain layer DUP and a lower drain layer DLP. Namely, the gate electrode 240, the source electrode 250S, and the drain electrode 250D have the same structure. Although not shown, the first and second gate lines GL1a and GL1b have the same structure as the gate electrode 240. Thus, the upper gate layer GUP, the upper source layer SUP, and the upper drain layer DUP are formed of the same material, and the lower gate layer GLP, the lower source layer SLP, and the lower drain layer DLP are formed of the same material. The upper gate layer GUP, the upper source layer SUP, and the upper drain layer DUP may be formed of a low resistance metal, for example, copper (Cu) and may have a thickness of 2,000 Å to 4,000 Å.

On the other hand, the sensing connection line VREFC and the first power connection line EVDDC have the two-layered structure, but have one-layered structure in the repair portion RPL. The sensing connection line VREFC and the first power connection line EVDDC are configured in a two-layered structure when the gate electrode 240, the source electrode 250S, and the drain electrode 250D are manufactured, but an etching process is performed to partially remove a thick Cu layer of each of the sensing connection line VREFC and the first power connection line EVDDC. As a result, the sensing connection line VREFC and the first power connection line EVDDC each have one-layered structure in the repair portion RPL.

More specifically, the sensing connection line VREFC has a two-layered structure including an upper sensing layer VUP and a lower sensing layer VLP, and the sensing connection line VREFC in the repair portion RPL has one-layered structure including the lower sensing layer VLP. Further, the first power connection line EVDDC has a two-layered structure including an upper power layer EUP and a lower power layer ELP, and the first power connection line EVDDC in the repair portion RPL has one-layered structure including lower power layer ELP.

The lower gate layer GLP, the lower source layer SLP, the lower drain layer DLP, the lower sensing layer VLP, and the lower power layer ELP may be formed of aluminum (Al), molybdenum (Mo), nickel (Ni), gold (Au), chrome (Cr), titanium (Ti), silver (Ag), magnesium (Mg), or an alloy thereof, and a transparent metal oxide layer such as indium tin oxide (ITO) or indium zinc oxide (IZO). Preferably, they may be formed of molybdenum titanium (MoTi). The lower gate layer GLP, the lower source layer SLP, the lower drain layer DLP, the lower sensing layer VLP, and the lower power layer ELP may have a thickness of 100 Å to 1,500 Å. Thus, because the sensing connection line VREFC and the first power connection line EVDDC in the repair portion RPL include only the lower sensing layer VLP and the lower power layer ELP, respectively, they have the thin thickness of 100 Å to 1,500 Å.

In the embodiment of the disclosure, the sensing connection line VREFC and the first power connection line EVDDC each have the two-layered structure including the upper layer and the lower layer, but have one-layered structure including only the lower layer by removing the upper layer in the repair portion RPL. Because the repair portions RPL of the sensing connection line VREFC and the first power connection line EVDDC include only the lower sensing layer VLP and the lower power layer ELP, respectively, the repair portions RPL of the sensing connection line VREFC and the first power connection line EVDDC are formed thin. Thus, the thin repair portions RPL of the sensing connection line VREFC and the first power connection line EVDDC can be easily cut through the laser irradiation in a repair process which will be performed later. As a result, a success rate of the repair process can increase.

Further, because the sensing connection line VREFC and the first power connection line EVDDC do not have the thick Cu layer, copper does not flow out of them due to the laser irradiation. As a result, a short circuit between the second electrode CAT and the sensing connection line VREFC and the first power connection line EVDDC can be prevented.

As described above, the OLED display according to the embodiments of the disclosure configures the repair portions of the first power connection line and the sensing connection line in one-layered structure, and thus can increase the repair success rate and prevent the short circuit between the second electrode and the first power connection line and the sensing connection line.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
   subpixels positioned on a first substrate, each subpixel including an emission area, in which a light emitting element is disposed, and a circuit area in which a circuit for driving the light emitting element is disposed; and
   a first power connection line, a sensing connection line, and at least one gate line positioned in the circuit area, each of the first power connection line, the sensing line and the gate line being connected to the subpixels,
   at least one electrically conductive layer being in the first power connection line and a plurality of stacked, electrically conductive layers being in the gate line, wherein the number of stacked layers of the gate line is greater than the number of layers in the first power line.

2. The display device of claim 1, wherein the first power connection line is connected from a first power line to the subpixels.

3. The display device of claim 2, wherein each subpixel further includes a sensing transistor positioned in the circuit area and including a gate electrode, a semiconductor layer, a source electrode, and a drain electrode,
   wherein the sensing connection line is connected to the drain electrode of the sensing transistor, and the gate line is connected to the gate electrode of the sensing transistor as one body.

4. The display device of claim 3, wherein the gate electrode and the source electrode each have a two-layered structure at least including an upper layer and a lower layer.

5. The display device of claim 4, wherein the upper layer of the gate electrode and the upper layer of the source electrode are formed of the same material, and the lower layer of the gate electrode and the lower layer of the source electrode are formed of the same material.

6. The display device of claim 4, wherein the drain electrode, the first power connection line, and the sensing connection line each have one-layered structure.

7. The display device of claim 6, wherein the drain electrode, the first power connection line, and the sensing connection line are formed of the same material as the lower layer of the gate electrode and the lower layer of the source electrode.

8. The display device of claim 4, wherein the drain electrode, the first power connection line, and the sensing connection line each have at least one-layered structure.

9. The display device of claim 8, wherein the drain electrode has a two-layered structure including an upper layer and a lower layer,
   wherein at least one of the first power connection line or the sensing connection line has one-layered structure in a repair portion and has a two-layered structure in an area except the repair portion.

10. The display device of claim 9, wherein the first power connection line and the sensing connection line each have one-layered structure including a lower layer and have a two-layered structure including an upper layer and a lower layer.

11. The display device of claim 10, wherein the lower layer of each of the drain electrode, the first power connection line, and the sensing connection line is formed of the same material as the lower layer of the gate electrode,
   wherein the upper layer of each of the drain electrode, the first power connection line, and the sensing connection line is formed of the same material as the upper layer of the gate electrode.

12. A display device comprising:
   subpixels positioned on a first substrate, each subpixel including an emission area, in which a light emitting element is disposed, and a circuit area in which a circuit for driving the light emitting element is disposed; and
   a first power connection line, a sensing connection line, and at least one gate line positioned in the circuit area, each of the first power connection line, the sensing line and the gate line being connected to the subpixels,
   at least one electrically conductive layer being in the sensing connection line and a plurality of stacked, electrically conductive layers being in the gate line, wherein the number of stacked layers of the gate line is greater than the number of layers in the sensing connection line.

13. The display device of claim 1, wherein the sensing connection line is connected from a sensing line to the subpixels.

14. The display device of claim 12, wherein each subpixel further includes a sensing transistor positioned in the circuit area and including a gate electrode, a semiconductor layer, a source electrode, and a drain electrode,
   wherein the sensing connection line is connected to the drain electrode of the sensing transistor, and the gate line is connected to the gate electrode of the sensing transistor as one body.

* * * * *